United States Patent
Mamola

(10) Patent No.: US 10,019,223 B2
(45) Date of Patent: Jul. 10, 2018

(54) SOFT DECISION AUDIO DECODING SYSTEM

(71) Applicant: Shure Acquisition Holdings, Inc., Niles, IL (US)

(72) Inventor: Robert Mamola, Oak Park, IL (US)

(73) Assignee: Shure Acquisition Holdings, Inc., Niles, IL (US)

( * ) Notice: Subject to any disclaimer, the term of this patent is extended or adjusted under 35 U.S.C. 154(b) by 0 days.

(21) Appl. No.: 14/844,632

(22) Filed: Sep. 3, 2015

(65) Prior Publication Data

US 2017/0068506 A1 Mar. 9, 2017

(51) Int. Cl.
| | |
|---|---|
| *G06F 3/16* | (2006.01) |
| *G10L 19/005* | (2013.01) |
| *G10L 19/00* | (2013.01) |
| *H03M 13/41* | (2006.01) |

(52) U.S. Cl.
CPC .............. *G06F 3/165* (2013.01); *G10L 19/00* (2013.01); *G10L 19/005* (2013.01); *H03M 13/4138* (2013.01)

(58) Field of Classification Search
CPC ...... H04L 5/003; H04L 5/0032–5/0035; H04L 5/0044–5/0046
USPC .................................................. 375/222–346
See application file for complete search history.

(56) References Cited

U.S. PATENT DOCUMENTS

| | | | |
|---|---|---|---|
| 6,980,602 B1 | 12/2005 | Kleinerman et al. | |
| 7,228,489 B1 | 6/2007 | Boyer | |
| 7,250,987 B2 * | 7/2007 | Goyal | H04N 5/44 348/555 |
| 8,583,427 B2 * | 11/2013 | Tackin | G10L 25/90 704/208 |
| 2003/0192001 A1 | 10/2003 | Maiuzzo et al. | |
| 2005/0177860 A1 * | 8/2005 | Goyal | H04N 5/44 725/118 |
| 2011/0255009 A1 * | 10/2011 | Goyal | H04N 5/44 348/726 |
| 2013/0089126 A1 * | 4/2013 | Walker | H04L 1/201 375/224 |

(Continued)

OTHER PUBLICATIONS

Fingscheidt, et al., "Softbit Speech Decoding: A New Approach to Error Concealment," IEEE Transactions on Speech and Audio Processing, vol. 9, No. 3, pp. 240-251, Mar. 2001.

(Continued)

*Primary Examiner* — Michael N Opsasnick
(74) *Attorney, Agent, or Firm* — William J. Lenz, Esq.; Neal, Gerber & Eisenberg LLP

(57) ABSTRACT

A soft decision audio decoding system for preserving audio continuity in a digital wireless audio receiver is provided that deduces the likelihood of errors in a received digital signal, based on generated hard bits and soft bits. The soft bits may be utilized by a soft audio decoder to determine whether the digital signal should be decoded or muted. The soft bits may be generated based on the detected point and a detected noise power, or by using a soft-output Viterbi algorithm. The value of the soft bits may indicate confidence in the strength of the hard bit generation. The soft decision audio decoding system may infer errors and decode perceptually acceptable audio without requiring error detection, as in conventional systems, as well as have low latency and improved granularity.

10 Claims, 7 Drawing Sheets

(56) References Cited

U.S. PATENT DOCUMENTS

2013/0301450 A1* 11/2013 Geirhofer .............. H04B 7/024
370/252

OTHER PUBLICATIONS

International Search Report and Written Opinion for PCT/US2016/050207 dated Dec. 5, 2016.
Hewavithana, et al., "Soft Decisions for DQPSK Demodulation for the Viterbi Decoding of the Convolutional Codes," Proceedings of International Conference on Acoustics, Speech and Signal Processing, vol. 4, pp. IV17-IV20, Apr. 6, 2003.

* cited by examiner

SOFT DECISION AUDIO DECODING SYSTEM

TECHNICAL FIELD

This application generally relates to a soft decision audio decoding system. In particular, this application relates to a soft decision audio decoding system for preserving audio continuity in a digital wireless audio receiver by deducing the likelihood of errors in a received digital signal with low latency and improved granularity.

BACKGROUND

Audio production can involve the use of many components, including microphones, wireless audio transmitters, wireless audio receivers, recorders, and/or mixers for capturing, recording, and presenting the sound of productions, such as television programs, newscasts, movies, live events, and other types of productions. The microphones typically capture the sound of the production, which is wirelessly transmitted from the microphones and/or the wireless audio transmitters to the wireless audio receivers. The wireless audio receivers can be connected to a recorder and/or a mixer for recording and/or mixing the sound by a crew member, such as a production sound mixer. Electronic devices, such as computers and smartphones, may be connected to the recorder and/or mixer to allow the crew member to monitor audio levels and timecodes.

Wireless audio transmitters, wireless audio receivers, wireless microphones, and other portable wireless communication devices include antennas for transmitting radio frequency (RF) signals which contain digital or analog signals, such as modulated audio signals, data signals, and/or control signals. Users of portable wireless communication devices include stage performers, singers, actors, news reporters, and the like. A wireless audio transmitter may transmit an RF signal that includes an audio signal to a wireless audio receiver. The wireless audio transmitter may be included in a wireless handheld microphone, for example, that is held by the user and includes an integrated transmitter and antenna. When the RF signal is received at the wireless audio receiver, the RF signal may be degraded due to interference. This degradation may cause the RF signal to have a poor signal-to-noise ratio (SNR), which results in bit errors that can cause audio artifacts. Typically, when significant audio artifacts are present, the output audio is muted. However, muting the output audio is undesirable in many situations and environments. The effects of such interference are most prevalent in harsh RF environments where physical and electrical factors influence the transmission and reception of RF signals, e.g., movement of the microphone within the environment, other RF signals, etc.

In a conventional wireless audio system, error detection techniques are typically utilized, e.g., parity checking such as a cyclic redundancy check (CRC), to determine whether bit errors are present in a digital signal received in an RF signal at a wireless receiver. Such error detection involves analyzing the digital signal at the transmitter, generating and adding parity information to the data when it is transmitted, and recalculating the parity of the received data at the receiver. If the recalculated parity does not match the transmitted parity, then it can be determined that there are bit errors in the data. While such error detection is relatively straightforward and easy to implement, it is not optimal in wireless audio systems in particular environments, such as when maintaining the continuity of the output audio is critical.

In particular, conventional error detection may result in an increased latency due to the recalculation of the parity of the data at the receiver. Conventional error detection also suffers from poor granularity and is typically unable to specify which bits of the data are errors, which may result in the discarding of large amounts of data and undesirable audio dropouts or mutes in the output audio. As a tradeoff, it is possible to decrease the size of the data being transmitted to reduce the latency and improve the granularity attributable to conventional error detection. However, by decreasing the size of the data being transmitted, more frequent parity calculations and transmissions would be needed with a significant cost to bandwidth. Furthermore, conventional error detection techniques typically have limitations of the number of errors that can be detected. In particular, parity checking may only reliably detect a certain number of errors within the data. If the data has more than this threshold number of errors, the parity check may still deemed to have passed, in some cases.

Accordingly, there is an opportunity for a soft decision audio decoding system that addresses these concerns. More particularly, there is an opportunity for a soft decision audio decoding system that preserves audio continuity in a digital wireless audio receiver by deducing the likelihood of errors in a received digital signal with low latency and improved granularity.

SUMMARY

The invention is intended to solve the above-noted problems by providing soft decision audio decoding systems and methods that are designed to, among other things: (1) generate hard bits and soft bits in a digital wireless audio receiver; (2) determine whether to decode the digital signal into a digital audio signal, based on the soft bits; and (3) maintain audio continuity while reducing latency and improving granularity.

In an embodiment, a method of receiving an audio signal represented by a digital signal may include detecting a point of a constellation associated with a digital modulation scheme in the digital signal from a received RF signal; detecting a noise power of the digital signal; generating hard bits based on the detected point of the constellation; generating soft bits based on the detected point of the constellation and the detected noise power; determining whether to decode the digital signal into a digital audio signal, based on the soft bits; generating the digital audio signal based on the digital signal, if it is determined to decode the digital signal into the digital audio signal; and muting the digital audio signal, if it is determine not to decode the digital signal into the digital audio signal.

In another embodiment, a method of receiving an audio signal represented by a digital signal may include detecting a sequence of symbols of a constellation associated with a digital modulation scheme in the digital signal from a received RF signal, wherein the sequence of symbols represents bits of the audio signal; determining a likely transmitted sequence of symbols based on error in the complex plane determined from running the detected sequence of symbols through a Viterbi algorithm; generating hard bits based on the determined likely transmitted sequence of symbols; generating soft bits based on a degree of closeness of the sequence of symbols to known legal sequences of symbols determined from running the sequence of symbols through a soft-output Viterbi algorithm; determining whether to decode the digital signal into a digital audio signal, based on the soft bits; generating the digital audio signal based on the digital signal, if it is determined to decode the digital signal into the digital audio signal; and muting the digital audio signal, if it is determine not to decode the digital signal into the digital audio signal.

In a further embodiment, a method of receiving an audio signal represented by a digital signal may include detecting a phase trajectory associated with a partial response non-linear phase modulation scheme in the digital signal from a received RF signal; determining a likely transmitted phase trajectory based on running the detected phase trajectory through a Viterbi algorithm; determining a likely transmitted phase trajectory based on running the detected phase trajectory through a Viterbi algorithm; generating soft bits based on a degree of closeness of the phase trajectory to known legal phase trajectories determined from running the phase trajectory through a soft-output Viterbi algorithm; determining whether to decode the digital signal into a digital audio signal, based on the soft bits; generating the digital audio signal based on the digital signal, if it is determined to decode the digital signal into the digital audio signal; and muting the digital audio signal, if it is determine not to decode the digital signal into the digital audio signal.

These and other embodiments, and various permutations and aspects, will become apparent and be more fully understood from the following detailed description and accompanying drawings, which set forth illustrative embodiments that are indicative of the various ways in which the principles of the invention may be employed.

DETAILED DESCRIPTION

Figure 1:
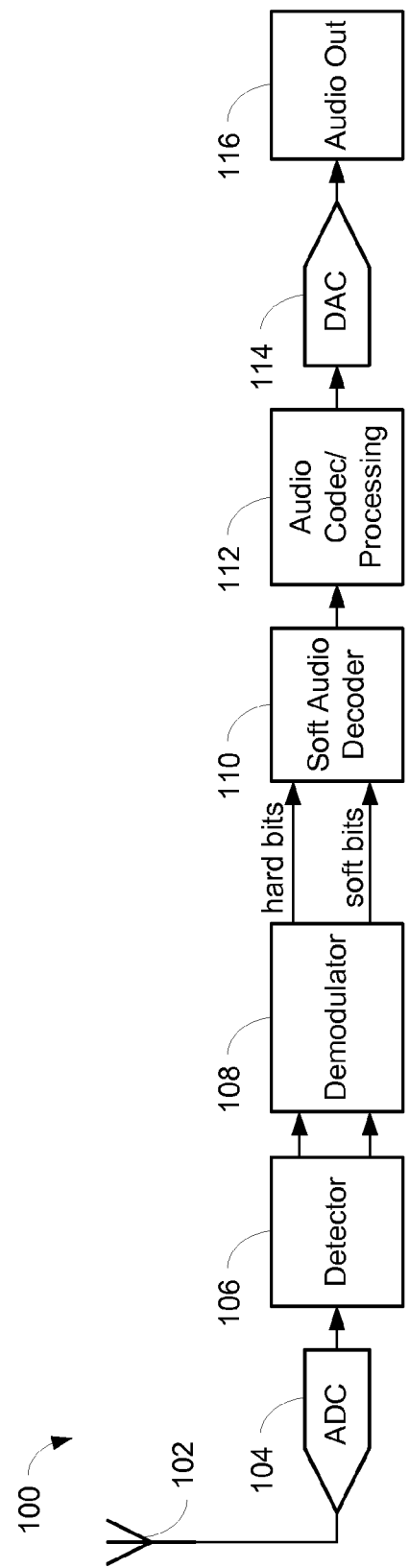
FIG. 1 is a block diagram of a wireless audio receiver including a soft decision audio decoding system, in accordance with some embodiments.

The description that follows describes, illustrates and exemplifies one or more particular embodiments of the invention in accordance with its principles. This description is not provided to limit the invention to the embodiments described herein, but rather to explain and teach the principles of the invention in such a way to enable one of ordinary skill in the art to understand these principles and, with that understanding, be able to apply them to practice not only the embodiments described herein, but also other embodiments that may come to mind in accordance with these principles. The scope of the invention is intended to cover all such embodiments that may fall within the scope of the appended claims, either literally or under the doctrine of equivalents.

It should be noted that in the description and drawings, like or substantially similar elements may be labeled with the same reference numerals. However, sometimes these elements may be labeled with differing numbers, such as, for example, in cases where such labeling facilitates a more clear description. Additionally, the drawings set forth herein are not necessarily drawn to scale, and in some instances proportions may have been exaggerated to more clearly depict certain features. Such labeling and drawing practices do not necessarily implicate an underlying substantive purpose. As stated above, the specification is intended to be taken as a whole and interpreted in accordance with the principles of the invention as taught herein and understood to one of ordinary skill in the art.

The soft decision audio decoding system described herein can be utilized in a digital wireless audio receiver to preserve audio continuity by deducing the likelihood of errors in a received digital signal with low latency and improved granularity. Hard bits and soft bits generated in the receiver are utilized by a soft audio decoder to determine whether the digital signal should be decoded or muted. In some embodiments, when a linear modulation scheme has been utilized, the hard bits may be generated based on a detected point (i.e., symbol) in a constellation associated with a digital modulation scheme of the digital signal. The value of the hard bits may be determined based on the distance between the detected point and defined points of the constellation. The soft bits may be generated based on the detected point, distance to the defined points of the constellation, and a detected noise power of the digital signal. In other embodiment, the hard bits may be generated based on a detected sequence of symbols that represents bits of the audio signal that is run through a Viterbi algorithm to determine a likely transmitted sequence of symbols. The soft bits may be generated based on a degree of closeness of the sequence of symbols to known legal sequences determined from running the sequence of symbols through a soft-output Viterbi algorithm for trellis-coded modulation. When a non-linear modulation scheme has been utilized, the hard bits may be generated based on a detected phase trajectory that is run through a Viterbi algorithm to determine a likely transmitted phase trajectory. The soft bits may be generated based on a degree of closeness of the phase trajectory to known legal phase trajectories determined from running the phase trajectory through a soft-output Viterbi algorithm. Additionally, in both linear and non-linear modulation schemes used in digital wireless audio systems applying forward error correction (FEC), soft-input, soft-output decoders can be applied to further refine the soft bit information prior to decoding the digital signal into audio.

Regardless of whether a linear or non-linear modulation scheme has been utilized, the value of the soft bits may indicate confidence in the strength of the hard bit generation. The soft audio decoder may determine whether to decode or mute the digital signal, based on the soft bits. Accordingly, the soft decision audio decoding system may infer errors and decode perceptually acceptable audio from the digital signal without requiring error detection, as in conventional systems.

Furthermore, because the soft decision audio decoding system has improved granularity by generating confidence information (i.e., the soft bits) on a bit-wise basis, the impact of short duration errors is minimized. In other words, if the soft audio decoder decides to mute the audio based on the soft bits, then such audio muting may be relatively short and imperceptible (or at least perceptually acceptable and preferable to a mute) because of its short duration. In addition, the bit-wise confidence information of the soft bits allows different classes of data within the same payload of data to be independently handled and processed. For example, when audio codecs are deployed, codewords comprised of bits of differing perceptual importance may be enabled through use of the soft decision audio decoding system, such as described in concurrently-filed and commonly owned patent application "Multiresolution Coding and Modulation System" Ser. No. 14/844,678, which is incorporated herein by reference in its entirety.

FIG. 1 is an exemplary block diagram of a wireless audio receiver 100 that includes a soft decision audio decoding system. The wireless audio receiver 100 may receive a transmitted RF signal that contains an audio signal from an audio source, such as a microphone or playback device. The wireless audio receiver 100 may process the received RF signal to produce an output analog audio signal 116. In some embodiments, the wireless audio receiver 100 may produce an output digital audio signal. The wireless audio receiver may be a rack mountable unit, portable unit, and/or camera mountable unit, in some embodiments. Processes 200 and 300 that may use the wireless audio receiver 100 are respectively shown in FIGS. 2 and 3. In particular, the wireless audio receiver 100 and the processes 200, 300, 400 may utilize the soft decision audio decoding system to ensure continuity of audio that is transmitted wirelessly. Various components included in the wireless audio receiver 100 may be implemented using software executable by one or more servers or computers, such as a computing device with a processor and memory, and/or by hardware (e.g., discrete logic circuits, application specific integrated circuits (ASIC), programmable gate arrays (PGA), field programmable gate arrays (FPGA), etc.

The transmitted RF signal may be received by a receiving antenna 102. The received RF signal may be sampled and converted into a digital signal by an analog to digital converter 104, and the digital signal may be provided to a detector 106. The digital modulation scheme may include linear modulation schemes, such as quadrature amplitude modulation (QAM) or quadrature phase shift keying (QPSK), and partial response non-linear modulation schemes, such as continuous phase modulation (CPM), for example.

Figure 2:
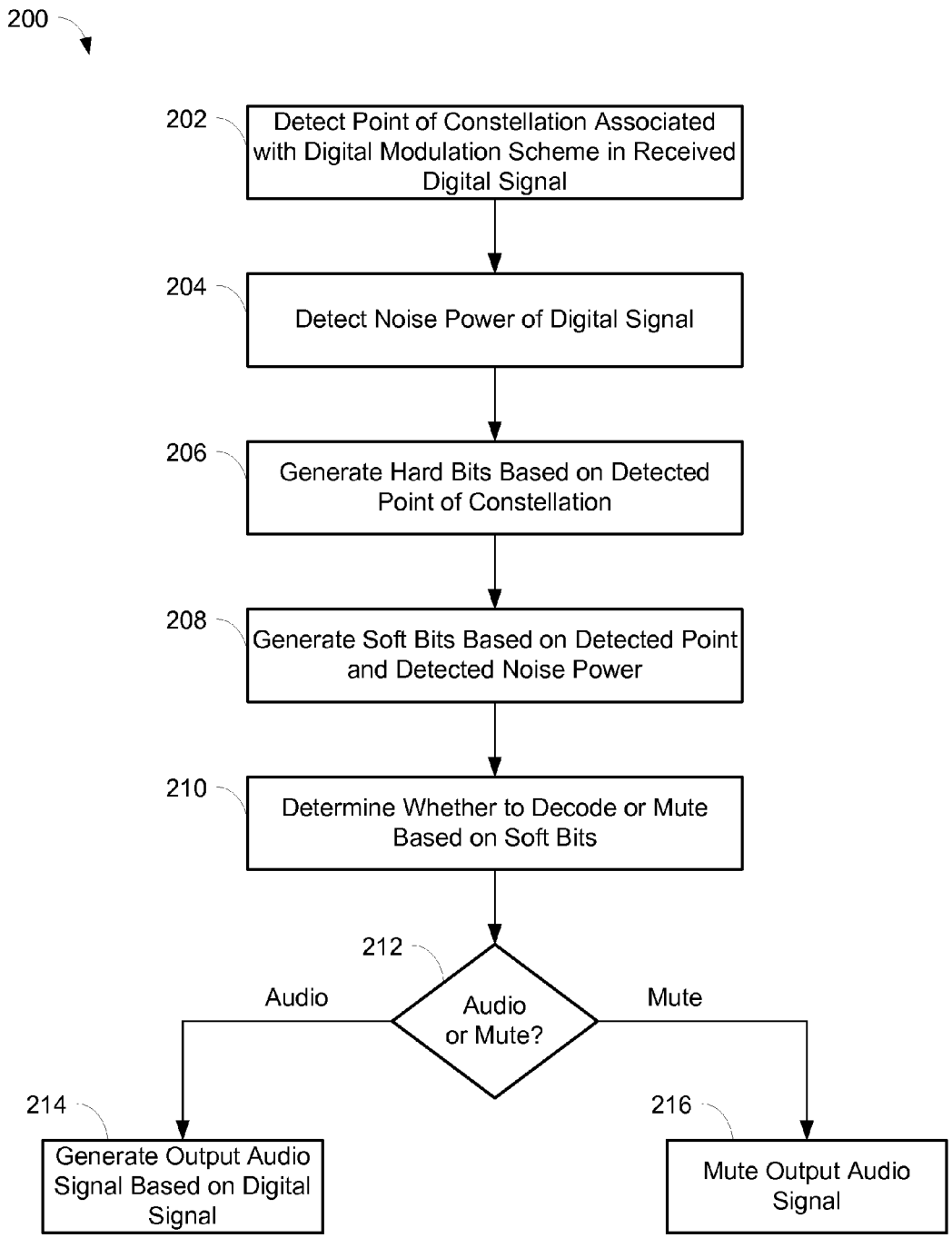
FIG. 2 is a flowchart illustrating operations for receiving an audio signal represented by a digital signal modulated by a linear digital modulation scheme using a soft decision audio decoding system in a wireless audio receiver, in accordance with some embodiments.

With regards to linear modulation schemes, the embodiment described by the process 200 shown in FIG. 2 may be utilized by the soft decision audio decoding system of the wireless audio receiver 100. In particular, the detector 106 may detect a point (i.e., symbol) in the digital signal that corresponds to a constellation associated with a digital modulation scheme being utilized, such as at step 202 of the process 200. The constellation associated with the digital modulation scheme may represent how a signal may be modulated in the complex plane (i.e., with in-phase (I) and quadrature (Q) axes). In ideal conditions, the point (i.e., symbol) detected in the received digital signal would exactly match the point in the transmitted RF signal. However, due to interference, the digital signal may have been degraded so that the point may not be exactly the same as in the transmitted RF signal.

The detector 106 may also detect the noise power of the digital signal, such as at step 204 of the process 200. The noise power may be detected by analyzing the perturbation of known symbols (e.g., pilots) embedded by the wireless transmitter within the digital symbol stream. The noise power may represent the presence of interference and/or the noise floor of the system. The magnitude of the perturbation may therefore represent the magnitude of the interference and/or noise. The perturbation of the known symbols may be defined as the distance between the received symbol and a known point of the constellation. The noise power $\sigma^2$ can may be calculated based on the equation $$\sigma^2 = \frac{1}{N} * \sum |rx_i - pilot_i|^2,$$

where N is the number of pilot symbols in an observation interval, $rx_i$ is the received symbol, and $pilot_i$ is the expected symbol.

The detected point and the detected noise power may be provided from the detector 106 to a demodulator 108 in the wireless audio receiver 100. The demodulator 108 may generate hard bits based on the detected point of the constellation, such as at step 206 of the process 200. The value of the hard bits may be 0 or 1, and be determined based on a distance of the detected point of the constellation to a defined point of the constellation. In particular, the value of the hard bits may be determined as the defined point of the constellation that is closest in distance to the detected point of the constellation.

The demodulator 108 may also generate soft bits based on the detected point of the constellation and the detected noise power, such as at step 208 of the process 200. The soft bits may represent the confidence in the strength of the hard bit generation, and be calculated as a log likelihood ratio. The log likelihood ratio may be determined based on an estimate of the noise power relative to a normalized constellation. In particular, the log likelihood ratio may be calculated based on the distance of the detected point of the constellation to an opposing point of the constellation, and be scaled by the detected noise power $\sigma^2$. The opposing point of the constellation may be a point of the constellation that represents an opposite result, e.g., 0, as compared to the detected point, e.g., 1. The magnitude of the log likelihood ratio may be lower when the detected noise power is higher, and conversely, the magnitude of the log likelihood ratio may be higher when the detected noise power is lower. The approximate log likelihood ratio L for a given bit b may be calculated based on the equation $$L_{approx}(b) = -\frac{1}{\sigma^2}[\min_{s \in S_0}((x-s_x)^2 + (y-s_y)^2) - \min_{s \in S_1}((x-s_x)^2 + (y-s_y)^2)],$$

where x and y represent the complex plane coordinates of the detected point and $s_x$ and $s_y$ represent the coordinates of the points of the constellation that represent when a bit is a 0 ($S_0$) or a 1 ($S_1$). The remaining steps 210-216 of the process 200 are described below.

Figure 3:
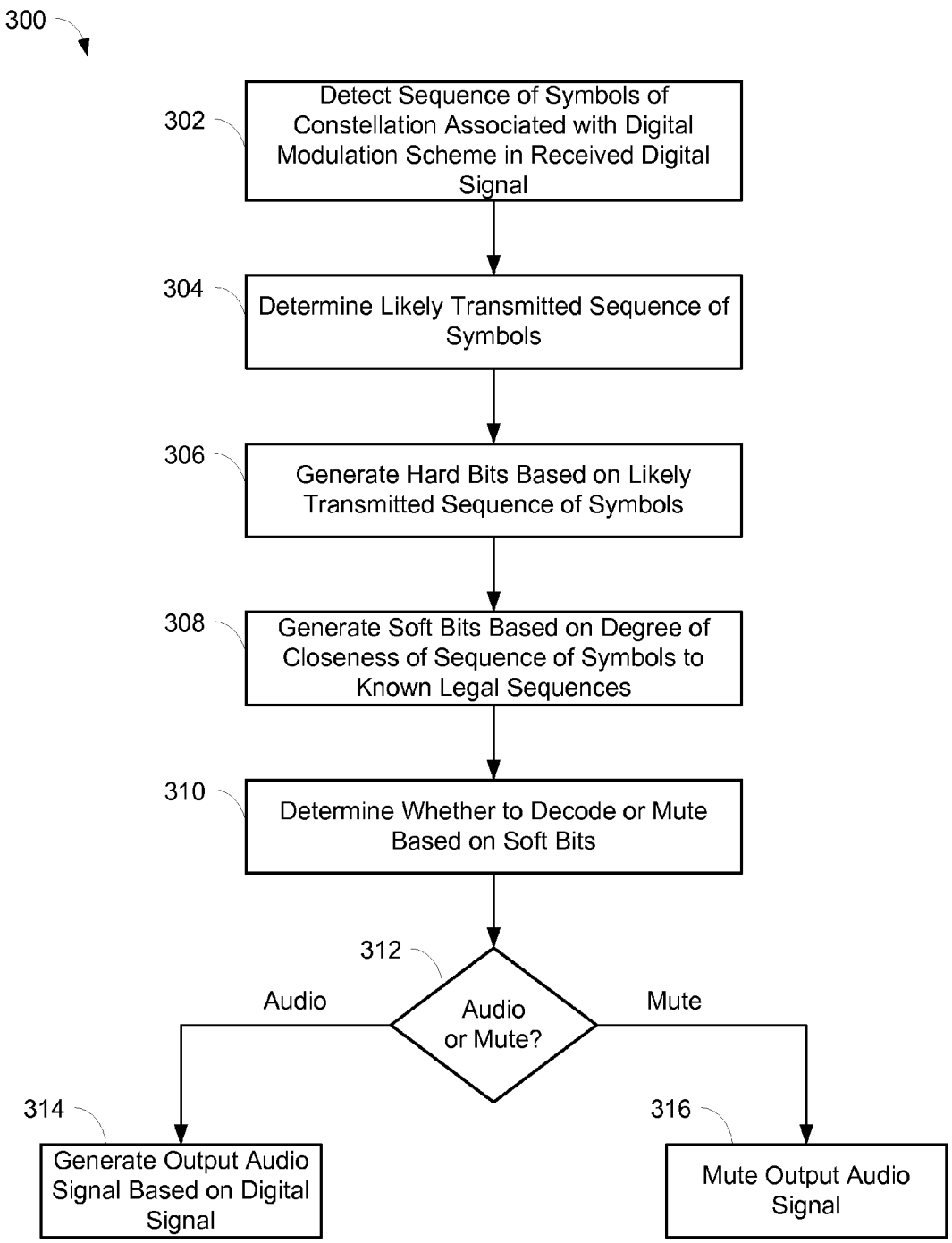
FIG. 3 is a flowchart illustrating operations for receiving an audio signal represented by a digital signal modulated by a linear digital modulation scheme using a soft decision audio decoding system in a wireless audio receiver, in accordance with some embodiments.

In another embodiment related to linear modulation schemes, the embodiment described by the process 300 shown in FIG. 3 may be utilized by the soft decision audio decoding system of the wireless audio receiver 100. In this embodiment, trellis-coded modulation may be utilized to map bits (representing audio) to symbols such that the sequence of the symbols that is transmitted is constrained. With trellis-coded modulation, the symbols of the constellation do not themselves represent bits, but rather, the sequence of the symbols represents bits. A Viterbi algorithm determines from the received sequence of symbols the most likely transmitted sequence of symbols and generates the hard bits based on the likely transmitted sequence of symbols. Soft bits, i.e., a log likelihood ratio, may be generated by a soft-output Viterbi algorithm, as is known in the art. The soft bits may represent the confidence in the strength of the hard bit generation, based upon the degree of closeness of the decoded sequence of symbols to known legal sequences of symbols.

In particular, the detector 106 may detect a sequence of symbols in the digital signal, such as at step 302 of the process 300. In ideal conditions, the detected sequence of symbols would exactly match the transmitted sequence of symbols, but the digital signal may have been degraded (due to interference) so that the detected sequence of symbols is not exactly the same. The detected sequence of symbols may be provided from the detector 106 to the demodulator 108. The demodulator 108 may determine a likely transmitted sequence of symbols by running the detected sequence of symbols through a Viterbi algorithm, such as at step 304 of the process 300. The likely transmitted sequence of symbols may be determined based on the degree of error in the complex plane between the detected sequence of symbols and known sequences of symbols.

The demodulator 108 may generate hard bits based on the likely transmitted sequence of symbols, such as at step 306 of the process 300. The value of the hard bits may be 0 or 1. The demodulator 108 may also generate soft bits based on running the detected sequence of symbols through a soft-output Viterbi algorithm, such as at step 308 of the process 300. The soft bits may be determined based on a degree of closeness of the detected sequence of symbols to known legal sequences of symbols. The remaining steps 310-316 of the process 300 are described below.

Figure 4:
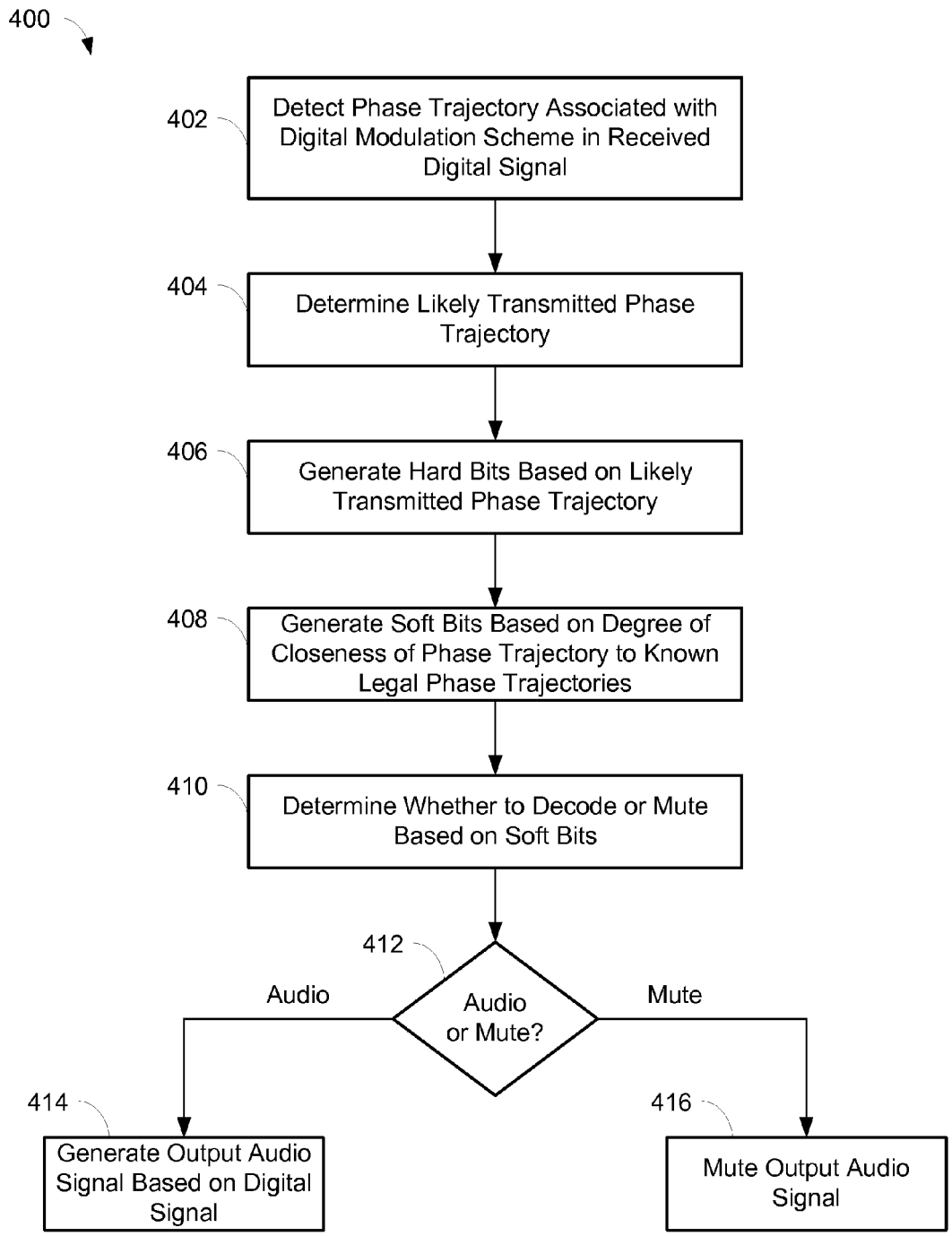
FIG. 4 is a flowchart illustrating operations for receiving an audio signal represented by a digital signal modulated by a partial response non-linear phase modulation scheme using a soft decision audio decoding system in a wireless audio receiver, in accordance with some embodiments.

With regards to partial response non-linear phase modulation schemes, the embodiment described by the process 400 shown in FIG. 4 may be utilized by the soft decision audio decoding system of the wireless audio receiver 100. In this embodiment, the bits (representing audio) may determine the phase trajectory of the transmitted signal. The phase trajectory is constrained by the partial response parameters of the system. A Viterbi algorithm determines from the received phase trajectory the most likely transmitted phase trajectory and generates the hard bits based on the likely transmitted phase trajectory. Soft bits, i.e., a log likelihood ratio, may be generated by a soft-output Viterbi algorithm, as is known in the art. The soft bits may represent the confidence in the strength of the hard bit generation, based upon the degree of closeness of the detected phase trajectory to known legal phase trajectories.

In particular, the detector 106 may detect a phase trajectory in the digital signal, such as at step 402 of the process 400. In ideal conditions, the detected phase trajectory would exactly match the transmitted phase trajectory, but the digital signal may have been degraded (due to interference) so that the detected phase trajectory is not exactly the same. The detected phase trajectory may be provided from the detector 106 to the demodulator 108. The demodulator 108 may determine a likely transmitted phase trajectory by running the detected phase trajectory through a Viterbi algorithm, such as at step 404 of the process 400.

The demodulator 108 may generate hard bits based on the likely transmitted phase trajectory, such as at step 406 of the process 400. The value of the hard bits may be 0 or 1. The demodulator 108 may also generate soft bits based on running the detected phase trajectory through a soft-output Viterbi algorithm, such as at step 408 of the process 400. The soft bits may be determined based on a degree of closeness of the detected phase trajectory to known legal phase trajectories. The remaining steps 410-416 of the process 400 are described below.

In some embodiments, the processes 200, 300, 400 may also include the ability to utilize soft-input, soft-output forward error correction (FEC) codes, as is known in the art, to further refine the generated soft bits. In particular, prior to transmission, the transmitter may encode the digital bit stream with FEC. The receiver 100 may include an FEC decoder that receives the digital signal that has been encoded with FEC. The FEC decoder may also receive the generated soft bits, and attempt to recover the original digital bit stream. The generated soft bits may be modified by the FEC decoder so that the soft audio decoder 110 determines whether to decode the digital signal into the digital audio signal, based on the modified soft bits.

In the processes 200, 300, 400, the log likelihood ratios generated at steps 208, 308, 408, respectively, may be a positive, zero, or negative value. If the log likelihood ratio is zero, then there is equal confidence in the hard bit being a 0 or 1. If the log likelihood ratio is positive, then there is greater confidence that the hard bit is 0, and conversely, if the log likelihood ratio is negative, then there is greater confidence that the hard bit is 1. The magnitude of the log likelihood ratio may indicate the degree of confidence.

For the processes 200, 300, and 400, the hard bits and soft bits may be provided to a soft audio decoder 110 from the demodulator 108. The soft audio decoder 110 may determine whether to decode the digital signal into a digital audio signal, based on the soft bits, and generate or mute the digital audio signal, such as at steps 210 and 212 of the process 200, steps 310 and 312 of the process 300, and steps 410 and 412 of the process 400. The soft audio decoder 110 may utilize soft threshold decoding or softbit decoding to determine whether to decode the digital signal into the audio signal.

In the embodiment of the soft audio decoder 110 related to soft threshold decoding, a subset of the bits of the audio codeword may be designated as having a high perceptual importance. This subset of codeword bits may represent a perceptually important frequency range and/or a minimally perceptually acceptable audio signal-to-noise ratio (SNR). The subset of the codeword bits designated as having the high perceptual importance may ultimately be decoded into audio, as described below.

Figure 5:
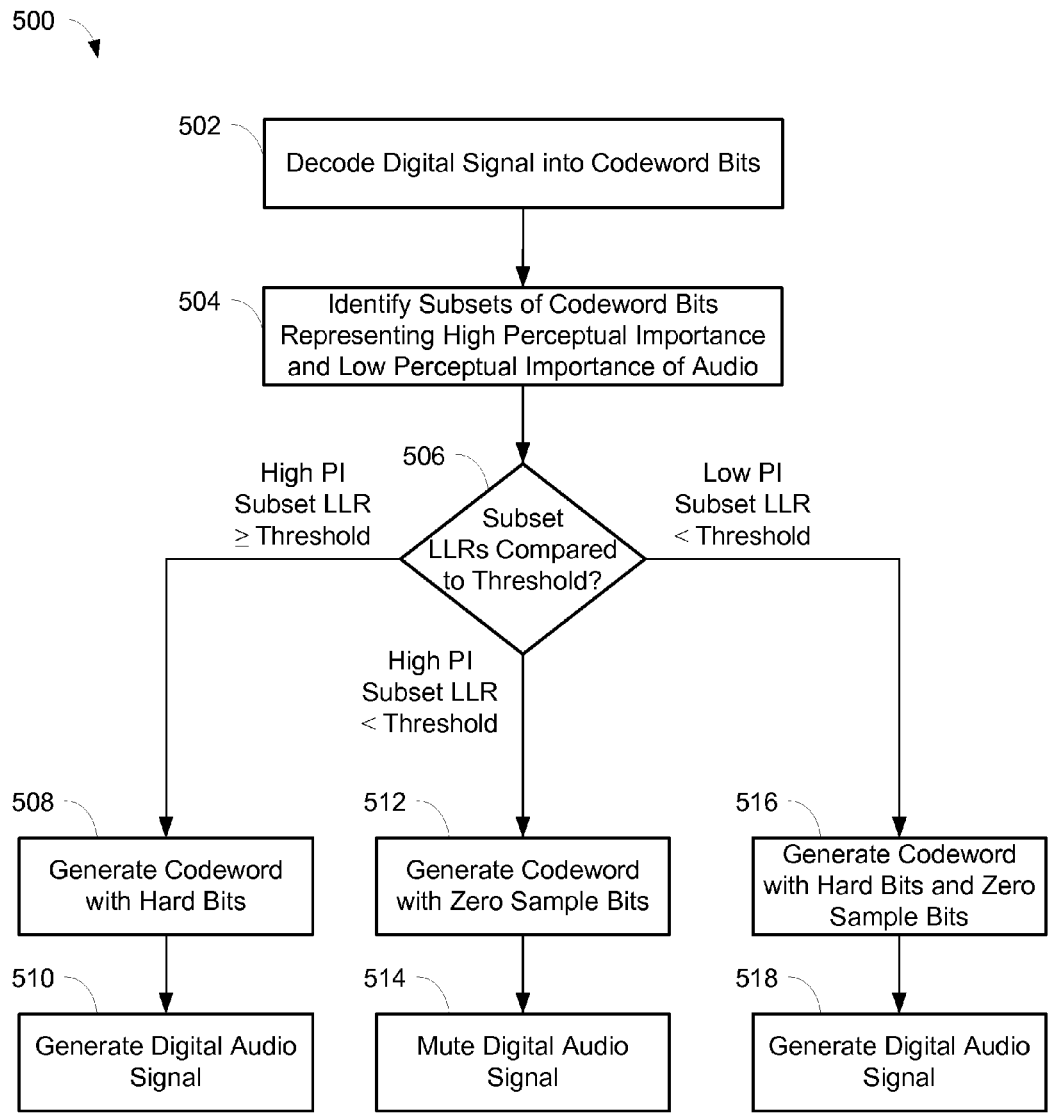
FIG. 5 is a flowchart illustrating operations for determining whether to decode a digital signal that includes coded audio based on frequency response using a soft decision audio decoding system in a wireless audio receiver, in accordance with some embodiments.

Regarding examining the frequency response to designate codeword bits as having a high perceptual importance, the process 500 shown in FIG. 5 may be utilized to determine whether to decode or mute the digital signal based on the soft bits, such as steps 210 and 212 of the process 200, steps 310 and 312 of the process 300, and steps 410 and 412 of the process 400. A typical frequency range for human hearing may be from approximately 0-24 kHz. However, certain frequency ranges can be deemed to have a higher perceptual importance than other frequency ranges. For example, if the audio is in a first frequency range, e.g., 0-12 kHz, the corresponding codeword bits in the digital signal can be assigned to have a high perceptual importance. In this example, audio with a frequency greater than 12 kHz may be deemed as less important since such audio is typically more difficult to hear. As another example, the codeword bits corresponding to audio in a frequency range of 0-6 kHz can be assigned to have a high perceptual importance, while audio with a frequency greater than 6 kHz may be deemed to be less important. Other frequency ranges for determining the perceptual importance of audio are possible and contemplated. In addition, although two frequency ranges are described above, more than two frequency ranges may be utilized, e.g., 0-8 kHz as one class of high perceptual importance, 8-16 kHz as another class of high perceptual importance, and 16-24 kHz as not having a high perceptual importance.

In the case of coded audio and examining the frequency response, the soft audio decoder 110 may decode the digital signal into codeword bits, such as at step 502 of the process 500 shown in FIG. 5. The soft audio decoder 110 may identify subsets of the codeword bits that represent high perceptual importance and low perceptual importance of the audio signal, such as at step 504. The log likelihood ratios (as represented by the soft bits) associated with each of the subsets may be compared to a predetermined threshold, such as at step 506. If the log likelihood ratio associated with the designated subset having a high perceptual importance is greater than or equal to the predetermined threshold, then the soft audio decoder 110 may generate a codeword based on the hard bits, such as at step 508. On the other hand, the soft audio decoder 110 may generate a zero sample codeword, such as at step 512, if the log likelihood ratio associated with the designated subset having a high perceptual importance is less than the predetermined threshold. The soft audio decoder 110 may also generate a partial zero sample codeword, such as at step 516, for the subset of the codeword bits that has a low perceptual importance, if the log likelihood ratio associated with the designated subset having a low perceptual importance is less than the predetermined threshold. Therefore, for coded audio, the resulting output audio signal may be based on the hard bits, a mute (zero sample codeword), or perceptually important bits with the less important bits muted.

Figure 6:
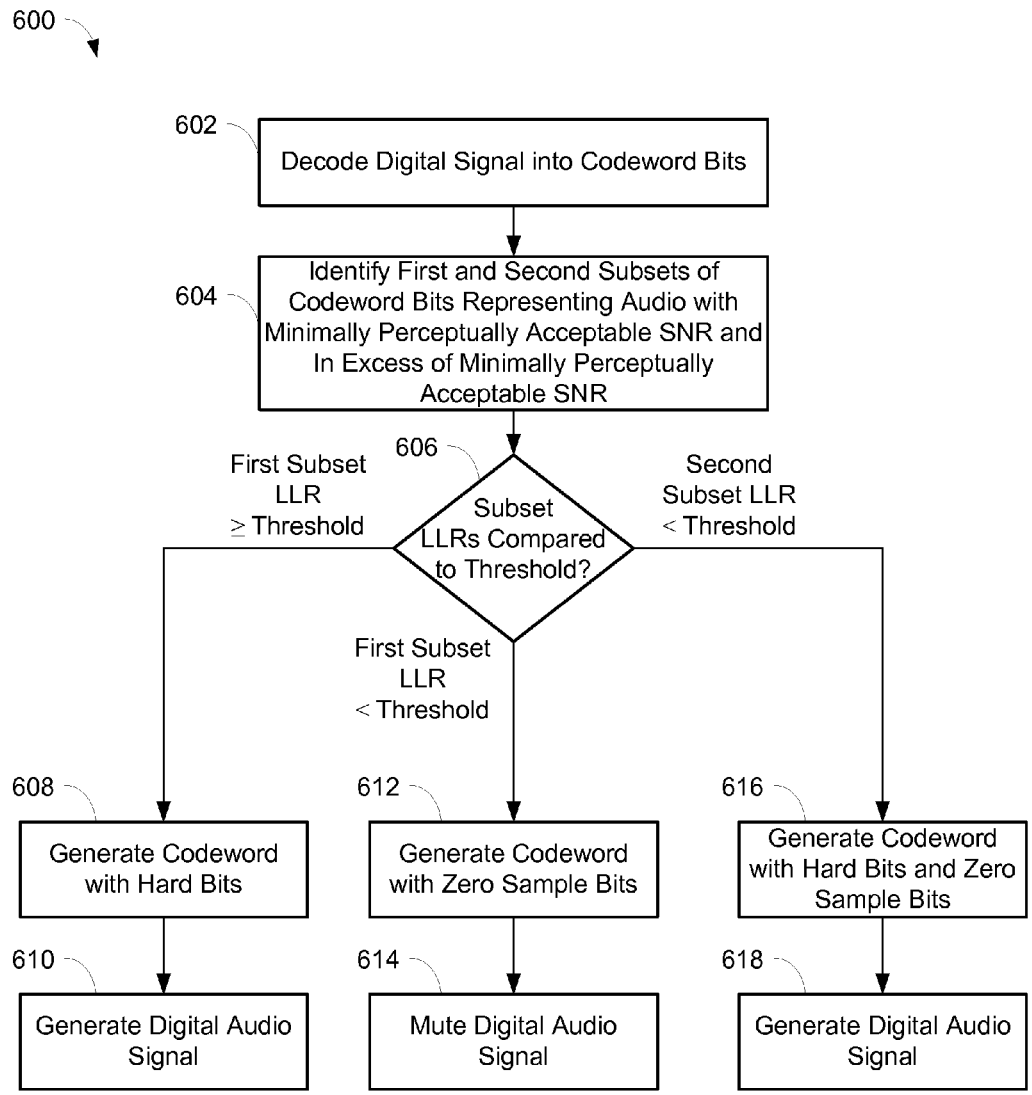
FIG. 6 is a flowchart illustrating operations for determining whether to decode a digital signal that includes coded audio based on signal-to-noise ratio using a soft decision audio decoding system in a wireless audio receiver, in accordance with some embodiments.

Regarding the SNR of the audio as a quality for perceptual grading, the process 600 shown in FIG. 6 may be utilized to determine whether to decode or mute the digital signal based on the soft bits, such as steps 210 and 212 of the process 200, steps 310 and 312 of the process 300, and steps 410 and 412 of the process 400. The perceptually important bits may be the codeword bits whose correct transmission will produce a perceptually acceptable (but decreased) audio SNR. In other words, if only the perceptually important bits of a codeword can be decoded, there may be a reduction in audio SNR as compared to the case when all bits of a codeword can be successfully decoded. For example, in an 8 bit codeword, the four most significant bits may achieve 24 dB of audio SNR and these bits would be considered to be perceptually important. In this example, the four least significant bits of the codeword may represent an additional 24 dB of audio SNR, assuming that the four perceptually important bits are successfully transmitted. In this case, the four least significant bits may be deemed as less important because the first 24 dB of audio SNR is more perceptually relevant than the step from 24 dB to 48 dB.

The soft audio decoder 110 may decode the digital signal into codeword bits, such as at step 602 of the process 600 shown in FIG. 6. The soft audio decoder 110 may identify, such as at step 604, a first subset of the codeword bits that represents the audio signal with a minimally perceptually acceptable SNR and a second subset of the codeword bits that represents the audio signal with an SNR in excess of the minimally perceptually acceptable SNR established by the first subset. The log likelihood ratios (as represented by the soft bits) associated with each of the subsets may be compared to a predetermined threshold, such as at step 606. If the log likelihood ratio associated with the first subset is greater than or equal to the predetermined threshold, then the soft audio decoder 110 may generate a codeword based on the hard bits, such as at step 608. On the other hand, the soft audio decoder 110 may generate a zero sample codeword, such as at step 612, if the log likelihood ratio associated with the first subset is less than the predetermined threshold. The soft audio decoder 110 may also generate a partial zero sample codeword, such as at step 616, for the subset of the codeword bits that has a low perceptual importance, if the log likelihood ratio associated with the second subset is less than the predetermined threshold.

In the case of uncoded audio, such as PCM audio, all of the bits have equal importance. In this case, the process 700 shown in FIG. 7 may be utilized to determine whether to decode or mute the digital signal based on the soft bits, such as steps 210 and 212 of the process 200, steps 310 and 312 of the process 300, and steps 410 and 412 of the process 400. The soft audio decoder 110 may decode the digital signal into bits, such as at step 702 of the process 700. The log likelihood ratio (as represented by the soft bits) associated with the PCM audio may be compared to a predetermined threshold, such as at step 704. If the log likelihood ratio associated with the PCM audio is greater than or equal to a predetermined threshold, then the soft audio decoder 110 may generate a PCM audio sample based on the hard bits, such as at step 706. However, the soft audio decoder 110 may generate a zero PCM audio sample if the log likelihood ratio is associated with the PCM audio is less than the predetermined threshold, such as at step 710. Therefore, for uncoded audio, the resulting output audio signal may either be based on the hard bits or a mute (the zero PCM audio sample).

The predetermined threshold used by the soft audio decoder 110 may be determined empirically. For example, models may be utilized to determine the correlation between log likelihood ratio values and actual errors so that a threshold can be chosen that maximizes the identification of errors while minimizing false positives (i.e., an error-free bit with a log likelihood ratio below the threshold). As another example, the threshold may be determined based on subjective standards by evaluating the behavior of an audio codec when errors are introduced into the digital signal.

In the embodiment of the soft audio decoder 110 related to softbit decoding, the soft audio decoder 110 may generate codewords from the digital signal or zero sample codewords, based on the bit-wise log likelihood ratio values (i.e., the soft bits) and a priori knowledge of the distribution of codewords, such as the likelihood of each of the possible codewords. The distribution of the codewords may have been previously generated or computed in real time using short-time histograms. Softbit decoding is only applicable to coded audio that utilized audio codecs.

The soft audio decoder 110 may use the log likelihood ratio values to determine transition probabilities, i.e., the likelihood of a received codeword over the set of all possible transmitted codewords. The transition probabilities and the distribution of the codewords can then be utilized by the soft audio decoder 110 to generate a posteriori probabilities that denote the likelihood of each of the possible codewords given the received codeword. The soft audio decoder 110 can output the most likely codeword based on these probabilities.

A mute may result from softbit decoding in the case when the magnitude of the log likelihood ratio is small, indicating a low confidence in the hard bits. For example, the audio codec may belong to a class known as adaptive differential pulse code modulation (ADPCM). For this type of codec, the a priori knowledge of the distribution of codewords is heavily weighted to the center of the codeword range, which corresponds to silence. As such, when the magnitude of the log likelihood ratio is relatively small, the softbit decoder would output a codeword that results in a muting of the audio.

Figure 7:
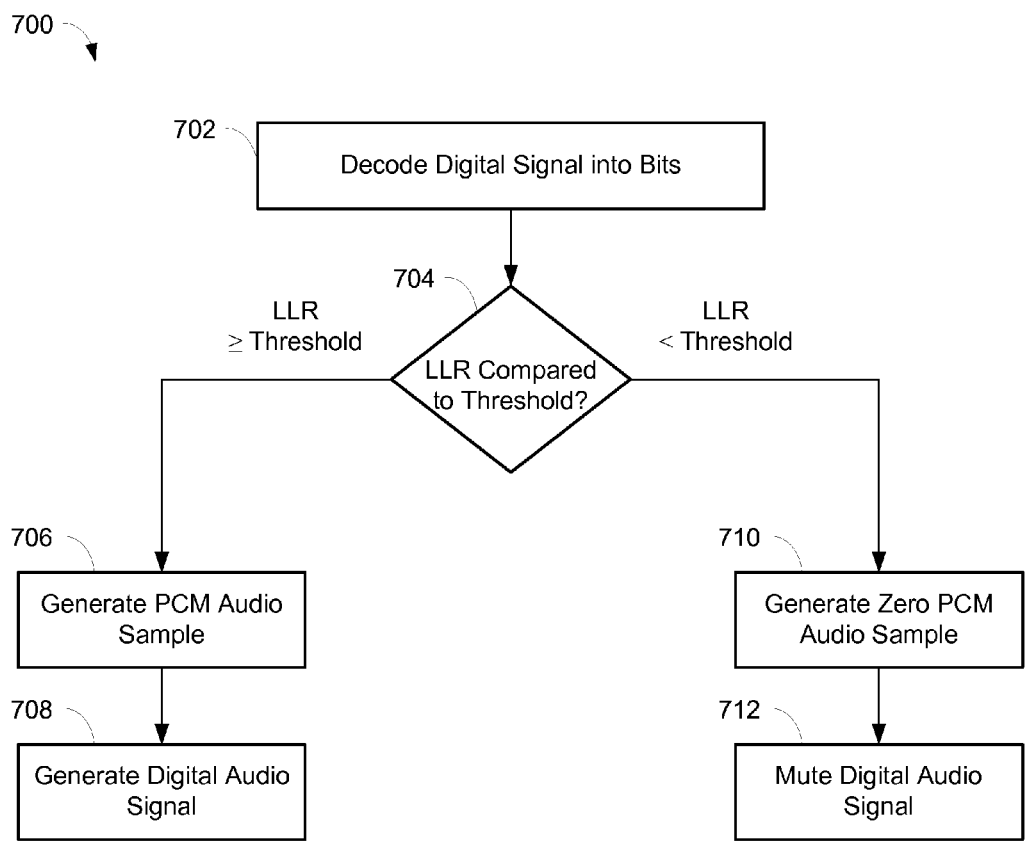
FIG. 7 is a flowchart illustrating operations for determining whether to decode a digital signal that includes PCM audio using a soft decision audio decoding system in a wireless audio receiver, in accordance with some embodiments.

Regardless of whether the soft audio decoder 110 utilizes soft threshold decoding or softbit decoding, if the soft audio decoder 110 generates a codeword or PCM audio sample (denoting that audio should be generated), then an audio codec/processor 112 may generate a digital audio signal based on the codeword or PCM audio sample, such as at step 214 of the process 200, step 314 of the process 300, or step 414 of the process 400. In particular, these steps are specifically shown in steps 510 and 518 of FIG. 5, steps 610 and 618 of FIG. 6, and step 708 of FIG. 7. In the case of FIGS. 5 and 6, the digital audio signal may be generated based on a codeword having hard bits (steps 510 and 610) or based on a codeword having hard bits and zero sample bits (steps 518 and 618). In the case of FIG. 7, the digital audio signal may be generated based on the PCM audio sample (step 708).

However, if the soft audio decoder 110 generates a zero sample codeword or zero PCM audio sample (denoting that the audio should be muted), then the audio codec/processor 112 may mute the audio signal, such as at step 216 of the process 200, step 316 of the process 300, or step 416 of the process 400. In particular, these steps are specifically shown in step 514 of FIG. 5, step 614 of FIG. 6, and step 712 of FIG. 7. In the case of FIGS. 5 and 6, the digital audio signal may be muted based on a codeword having a zero sample codeword (steps 514 and 614), and in the case of FIG. 7, the digital audio signal may be muted based on the zero PCM audio sample (step 712). In some embodiments, the output digital audio signal from the audio codec/processor 112 may be converted into an output analog audio signal 116 by a digital to analog converter 114. The output analog audio signal 116 may be utilized as desired, such as being further processed by downstream equipment (e.g., mixers, recorders, etc.), played on loudspeakers, etc.

Any process descriptions or blocks in figures should be understood as representing modules, segments, or portions of code which include one or more executable instructions for implementing specific logical functions or steps in the process, and alternate implementations are included within the scope of the embodiments of the invention in which functions may be executed out of order from that shown or discussed, including substantially concurrently or in reverse order, depending on the functionality involved, as would be understood by those having ordinary skill in the art.

This disclosure is intended to explain how to fashion and use various embodiments in accordance with the technology rather than to limit the true, intended, and fair scope and spirit thereof. The foregoing description is not intended to be exhaustive or to be limited to the precise forms disclosed. Modifications or variations are possible in light of the above teachings. The embodiment(s) were chosen and described to provide the best illustration of the principle of the described technology and its practical application, and to enable one of ordinary skill in the art to utilize the technology in various embodiments and with various modifications as are suited to the particular use contemplated. All such modifications and variations are within the scope of the embodiments as determined by the appended claims, as may be amended during the pendency of this application for patent, and all equivalents thereof, when interpreted in accordance with the breadth to which they are fairly, legally and equitably entitled.

The invention claimed is:

1. A method of receiving an audio signal represented by a digital signal, comprising:
    detecting a point of a constellation associated with a digital modulation scheme in the digital signal from a received RF signal;
    detecting a noise power of the digital signal;
    generating hard bits based on the detected point of the constellation;
    generating soft bits based on the detected point of the constellation and the detected noise power, wherein generating the soft bits comprises determining an approximate log likelihood ratio indicating a confidence in a strength of the generated hard bits, based on a distance of the detected point of the constellation to an opposing point of the constellation, the distance scaled by the detected noise power;
    determining whether to decode the digital signal into a digital audio signal, based on the soft bits;
    generating the digital audio signal based on the digital signal, if it is determined to decode the digital signal into the digital audio signal; and
    generating a muted digital audio signal, if it is determined not to decode the digital signal into the digital audio signal.

2. The method of claim 1, wherein generating the hard bits comprises determining a value of the hard bits based on a distance of the detected point of the constellation to defined points of the constellation.

3. The method of claim 1, wherein the magnitude of the approximate log likelihood ratio is lower when the detected noise power is higher and the magnitude of the approximate log likelihood ratio is higher when the detected noise power is lower.

4. The method of claim 1, wherein determining the approximate log likelihood ratio comprises determining the approximate log likelihood ratio based on the noise power relative to a normalized constellation, wherein the noise power is calculated based on a perturbation of one or more pilot symbols embedded in a digital bit stream of the digital signal.

5. The method of claim 1, wherein determining whether to decode the digital signal into the digital audio signal comprises:
    decoding the digital signal into codeword bits;
    identifying a first subset of the codeword bits representing a high perceptual importance of the audio signal and a second subset of the codeword bits representing a low perceptual importance of the audio signal;

generating a codeword including the hard bits, if the magnitude of the approximate log likelihood ratio associated with the first subset is greater than or equal to a predetermined threshold; and generating the codeword with zero sample bits, if the magnitude of the approximate log likelihood ratio associated with the first subset is less than the predetermined threshold; and generating the codeword including the hard bits and the zero sample bits, if the magnitude of the approximate log likelihood ratio associated with the second subset is less than the predetermined threshold.

6. The method of claim 5, wherein:

generating the digital audio signal comprises generating the digital audio signal based on the codeword including the hard bits, if the magnitude of the approximate log likelihood ratio associated with the first subset is greater than or equal to the predetermined threshold;

generating the muted digital audio signal comprises generating the muted digital audio signal based on the codeword with the zero sample bits, if the magnitude of the approximate log likelihood ratio associated with the first subset is less than the predetermined threshold; and generating the digital audio signal comprises generating the digital audio signal based on the codeword including the hard bits and the zero sample bits, if the magnitude of the approximate log likelihood ratio associated with the second subset is less than the predetermined threshold.

7. The method of claim 1, wherein:

determining whether to decode the digital signal into the digital audio signal comprises:

decoding the digital signal into bits;

generating a PCM audio sample from the bits, if the magnitude of the approximate log likelihood ratio associated with the bits is greater than or equal to a predetermined threshold; and generating a zero PCM audio sample, if the magnitude of the approximate log likelihood ratio associated with the bits is less than the predetermined threshold;

generating the digital audio signal comprises generating the digital audio signal based on the PCM audio sample, if the magnitude of the approximate log likelihood ratio associated with the bits is greater than or equal to the predetermined threshold; and generating the muted digital audio signal comprises generating the muted digital audio signal based on the zero PCM audio sample, if the magnitude of the approximate log likelihood ratio associated with the bits is less than the predetermined threshold.

8. The method of claim 1, wherein determining whether to decode the digital signal into the digital audio signal comprises:

decoding the digital signal into codeword bits;

identifying a first subset of the codeword bits representing the audio signal with a minimally perceptually acceptable signal-to-noise ratio (SNR) and second subset of the codeword bits representing the audio signal with an SNR in excess of the minimally perceptually acceptable SNR established by the first subset;

generating a codeword including the hard bits, if the magnitude of the approximate log likelihood ratio associated with the first subset is greater than or equal to a predetermined threshold; and generating the codeword with zero sample bits, if the magnitude of the approximate log likelihood ratio associated with the first subset is less than the predetermined threshold; and generating the codeword including the hard bits and the zero sample bits, if the magnitude of the approximate log likelihood ratio associated with the second subset is less than the predetermined threshold.

9. The method of claim 8, wherein:

generating the digital audio signal comprises generating the digital audio signal based on the codeword including the hard bits, if the magnitude of the approximate log likelihood ratio associated with the first subset is greater than or equal to the predetermined threshold;

generating the muted digital audio signal comprises generating the muted digital audio signal based on the codeword with the zero sample bits, if the magnitude of the approximate log likelihood ratio associated with the first subset is less than the predetermined threshold; and generating the digital audio signal comprises generating the digital audio signal based on the codeword including the hard bits and the zero sample bits, if the magnitude of the approximate log likelihood ratio associated with the second subset is less than the predetermined threshold.

10. The method of claim 1:

further comprising:

decoding the digital signal encoded with a forward error correction (FEC) code; and modifying the soft bits based on the decoded digital signal;

wherein determining whether to decode the digital signal comprises determining whether to decode the digital signal into the digital audio signal, based on the modified soft bits.

* * * * *